United States Patent [19]

Schnabel

[11] Patent Number: 5,021,750

[45] Date of Patent: Jun. 4, 1991

[54] CMOS OSCILLATOR

[75] Inventor: Jürgen Schnabel, Ilsfeld, Fed. Rep. of Germany

[73] Assignee: Alcatel N.V., Amsterdam, Netherlands

[21] Appl. No.: 505,247

[22] Filed: Apr. 3, 1990

[30] Foreign Application Priority Data

Apr. 3, 1989 [DE] Fed. Rep. of Germany ....... 3910712

[51] Int. Cl.$^5$ .............................................. H03B 5/24
[52] U.S. Cl. .................................... 331/111; 331/143
[58] Field of Search ............... 331/108 R, 111, 113 R, 331/143, 144

[56] References Cited

U.S. PATENT DOCUMENTS 4,083,020 4/1978 Goldberg ....................... 331/113 R
4,623,851 11/1976 Abou ................................... 331/111

FOREIGN PATENT DOCUMENTS 0180084 5/1986 European Pat. Off. .
7119323 1/1972 France .
1354358 5/1974 United Kingdom .

OTHER PUBLICATIONS

IBM Technical Disclosure Bulletin, vol. 30, No. 8, Jan. 1988.
Grebene, Alan J., *Integrated-Circuit Oscillators and Timers*, John Wiley & Sons, 1984, pp. 580-587.

*Primary Examiner*—Robert J. Pascal
*Attorney, Agent, or Firm*—Christie, Parker & Hale

[57] ABSTRACT

A high-speed, temperature- and parameter-stable, controllable CMOS oscillator is suitable for low to very high frequencies, e.g., clearly above 100 MHz. The oscillator includes a two-stage differential amplifier (D) and two controlled current sources (I1, I2) which are interconnected via a frequency-determining capacitor (C). The two current sources (I1, I2) are connected to the inputs (IN1, IN2) of the differential amplifer (D) through a first resistor (R1) and a second resistor (R2), respectively. By means of a first switching unit (S1) connected to the inputs of the differential amplifier (D), a first current path is completed in response to the voltage drop across the first resistor (R1) to charge the capacitor to a first state, and by means of a second switching unit (S2), a second current path is completed in response to the voltage drop across the second resistor (R2) to discharge the capacitor (C) to a second state.

18 Claims, 4 Drawing Sheets

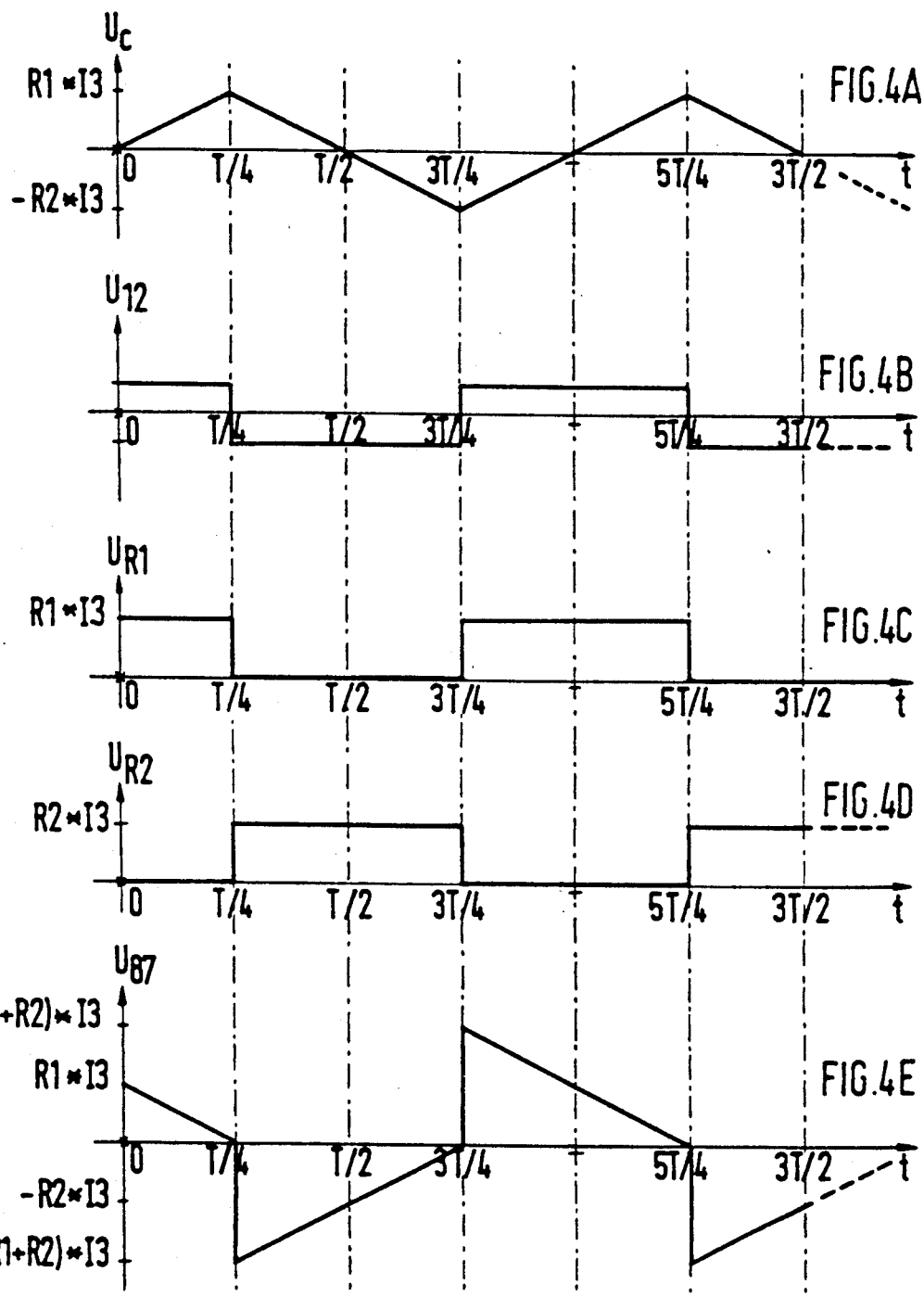

CMOS OSCILLATOR

TECHNICAL FIELD

The present invention relates to a CMOS oscillator.

1. Claim For Priority

This application is based on and claims priority from an application first filed in Fed. Rep. Germany on 3 Apr 1989 under Ser. No. 39 10 712.4. To the extent such prior application may contain any additional information that might be of any assistance in the use and understanding of the invention claimed herein, it is hereby incorporated by reference.

2. Background Art

A prior art CMOS relaxation oscillator uses simple CMOS inverter stages as gain blocks to which an external RC network is connected. Furthermore, such CMOS relaxation oscillators are constructed by means of a plurality of series-connected CMOS inverter stages in a manner similar to emitter-coupled multivibrators (Grebene, Alan B., "Bipolar and MOS analog integrated circuit design", 1983, ISBN 0-471-085 29-4, Chapters 11.5 and 11.6). A drawback of such oscillators is relatively poor temperature stability with increasing frequency, so that they are unsuitable for high frequencies in the range above 30–50 MHz.

DISCLOSURE OF INVENTION

It is the object of the invention to provide a high-speed temperature- and parameter-stable controllable CMOS oscillator which is suitable for low to very high frequencies, e.g., clearly above 100 MHz.

The oscillator in accordance with the invention can be implemented using CMOS monolithic integrated circuitry, thus having largely identical component characteristics on a semiconductor chip as well as low-input current drive requirements and very low power consumption while exhibiting high accuracy.

In particular, such an oscillator according to the invention is universally applicable as a cell on a larger CMOS chip, e.g., as part of a phase-locked loop (PLL).

Via the two controlled current sources, the oscillator frequency can be changed linearly (current-controlled oscillator principle). By the variation of the capacitance, the frequency can be changed within very wide limits, i.e., up to 200 MHz.

BRIEF DESCRIPTION OF DRAWINGS

An embodiment of the invention will now be explained with reference to the accompanying drawings, in which:

FIG. 4 is a timing diagram serving to explain the operation of the oscillator in accordance with the invention.

BEST MODE FOR CARRYING OUT THE INVENTION

Figure 1:
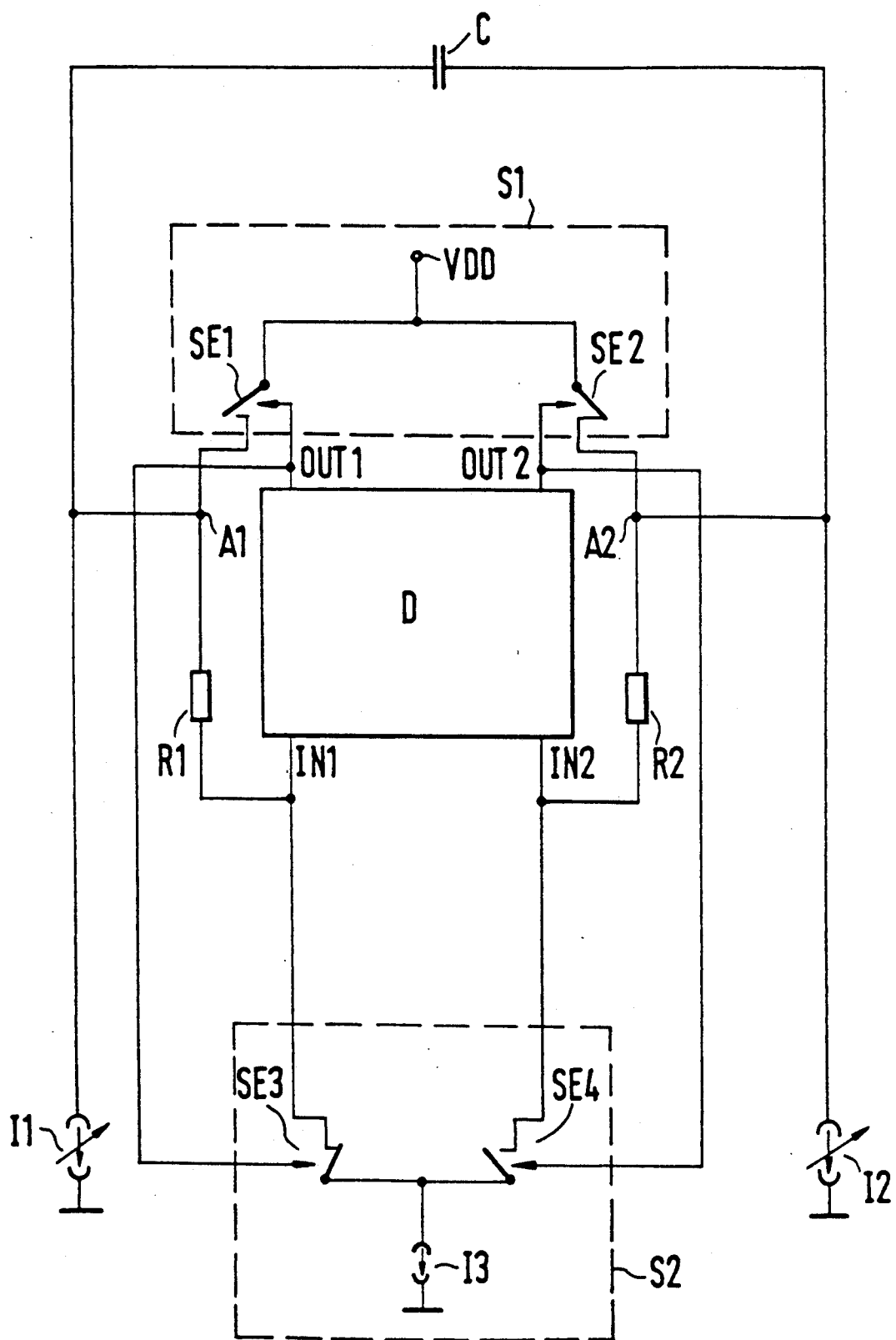
FIG. 1 is a schematic circuit diagram of the oscillator in accordance with the invention.

Referring to FIG. 1, a CMOS oscillator in accordance with the invention comprises a differential amplifier D, a first switching unit S1 containing a first switching element SE1 and a second switching element SE2, a second switching unit S2 containing a third switching element SE3 and a fourth switching element SE4, a first controlled current source I1, and a second controlled current source I2. The two controlled current sources I1, I2 are interconnected via a capacitor C.

The first current source I1 is also connected through a first resistor R1 to a first input IN1 of the differential amplifier D, and the second current source I2 is connected through a second resistor R2 to a second input IN2 of the differential amplifier D.

A supply-voltage terminal VDD (+5 V) is connectable via the switching path of the first switching element SE1 to a first tap A1 located between the first current source I1 and the first resistor R1, or via the switching path of the second switching element SE2 to a second tap A2 located between the second current source I2 and the second resistor R2.

A first output OUT1 and a second output OUT2 of the differential amplifier D are connected to a control input of the first switching element SE1 and to a control input of the second switching element SE2, respectively.

Either the first input IN1 or the second input IN2 of the differential amplifier D is connectable to a third CMOS current source I3 via the switching path of the third switching element SE3 or via the switching path of the fourth switching element SE4, respectively. A control input of the third switching element SE3 and a control input of the fourth switching element SE4 are connected to the first output OUT1 and the second output OUT2, respectively, of the differential amplifier D.

A preferred embodiment of the oscillator according to the invention will now be described in detail with the aid of FIG. 2.

The first switching unit S1 consists of a first NMOS transistor N1, which forms the first switching element SE1, and a second NMOS transistor N2, which forms the second switching element SE2, and associated first and second current mirrors.

The first current mirror is made up of a first PMOS transistor P1 and a second PMOS transistor P2. The two drain terminals are connected to the supply-voltage terminal VDD. The two gate terminals are connected together, and the source terminal of the second PMOS transistor P2 is coupled back to the interconnected gate terminals and connected to the drain terminal of the first NMOS transistor N1. The source terminal of the first PMOS transistor P1 is connected to the first tap A1.

The second current mirror is made up of a third PMOS transistor P3 and a fourth PMOS transistor P4 and is symmetrical with respect to the first current mirror. Accordingly, it is connected to the second NMOS transistor N2 (source terminal of P3 to drain terminal of N2) and the second tap A2 (connected to the source terminal of P4).

The source terminals of the first and second NMOS transistors N1, N2 are connected together and to the fourth current source I4. The gate terminals of the first NMOS transistor N1 and the second NMOS transistor N2 form the control inputs of the first switching element SE1 and the second switching element SE2, respectively (cf. FIG. 1).

The second switching unit S2 contains a third NMOS transistor N3, forming the third switching element, and a fourth NMOS transistor N4, forming the fourth switching element. The drain terminal of the third NMOS transistor N3 is connected to that terminal of the first resistor R1 which is remote from the first tap A1, and the drain terminal of the fourth NMOS transistor N4 is connected to that terminal of the second resistor R2 which is remote from the second tap A2. The source terminals of N3 and N4 are connected together and to the third current source I3. The gate terminals of the third NMOS transistor N3 and the fourth NMOS transistor N4 form the control inputs of the third switching element SE3 and the fourth switching element SE4, respectively (cf. FIG. 1).

Figure 2:
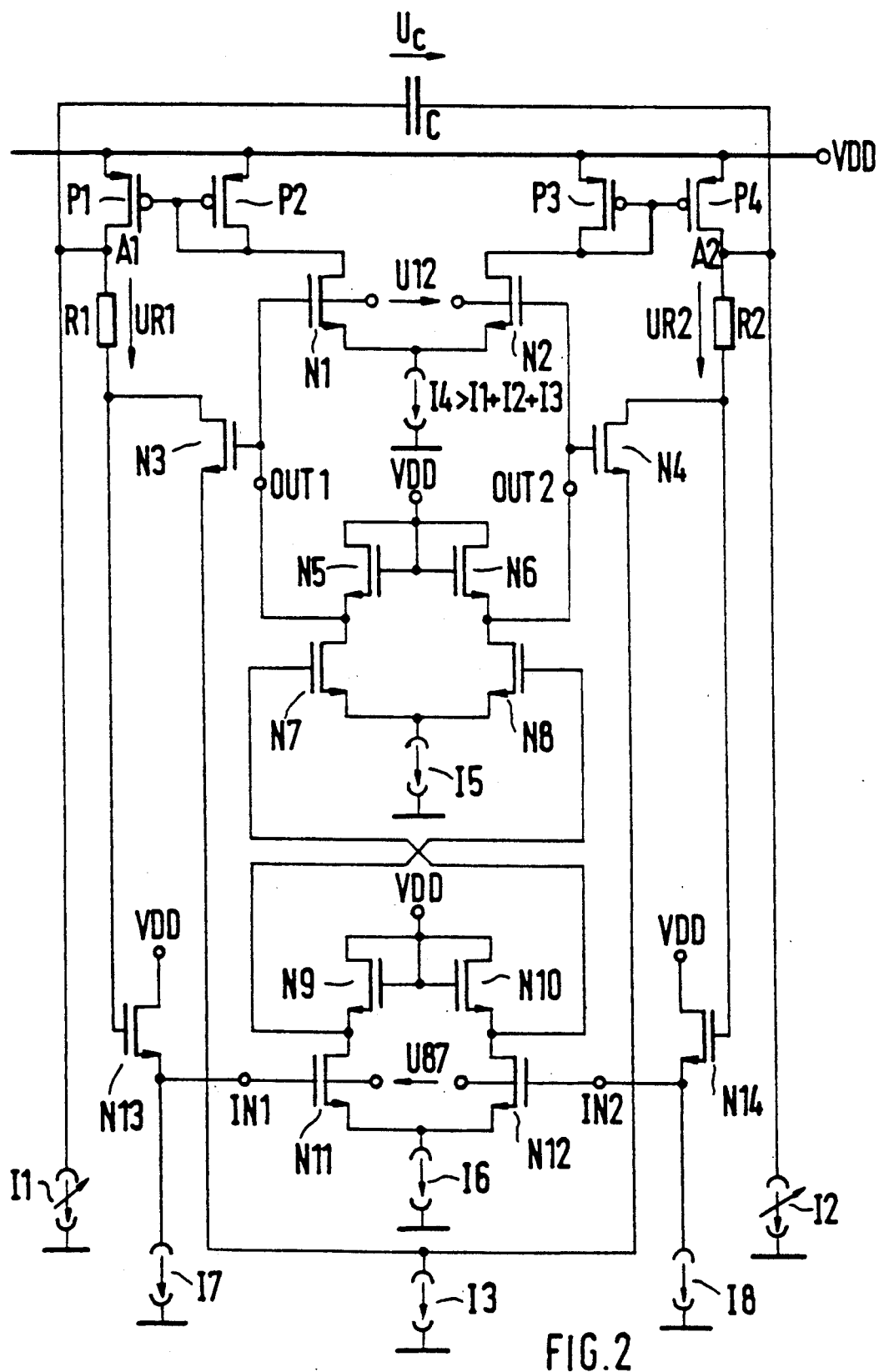
FIG. 2 is a detailed circuit diagram of the oscillator in accordance with the invention.

As shown in FIG. 2, the differential amplifier D is designed as a cascaded two-stage amplifier circuit. The first differential-amplifier stage consists of fifth, sixth, seventh, and eighth NMOS transistors N5, N6, N7, N8 and a fifth CMOS current source I5. Analogously, a second differential-amplifier stage consists of ninth, tenth, eleventh, and twelfth NMOS transistors N9, N10, N11, N12 and a sixth CMOS current source I6.

The drain terminals and the interconnected gate terminals of N5 and N6 are connected to the supply-voltage terminal VDD. The source terminals of N5 and N6 form the first output OUT1 and the second output OUT2, respectively, of the differential amplifier D (see also FIG. 1). The two transistors N5, N6 represent the two load resistances of a conventional differential amplifier. The source terminals of N7 and N8 are connected together and to the fifth current source I5. The drain terminals of N7 and N8 are connected to the source terminals of N5 and N6, respectively. The gate terminals of N7 and N8 form a first output and a second input, respectively, of the first the first differential-amplifier stage. The two NMOS transistors represent the first stage of the differential amplifier.

The second differential-amplifier stage is constructed analogously to the first differential-amplifier stage, with the ninth NMOS transistor N9 and the tenth NMOS transistor N10 representing the two load resistances, and the eleventh NMOS transistor N11 and the twelfth NMOS transistor N12 forming the second amplifier stage (cf. FIG. 2).

The drain terminals of N11 and N12 are connected to the second and first outputs, respectively, of the first differential amplifier stage. The gate terminals of N11 and N12 form the first input IN1 and the second input IN2, respectively, of the differential amplifier D.

The first controlled current source I1 and the second controlled current source I2 are connected together via the frequency-determining capacitor C. The first current source I1 is connected to the drain terminal of N3 through the first resistor R1, and the second current source I2 is connected to the drain terminal of N4 through the second resistor R2.

According to an advantageous aspect of the invention, the terminal of the first resistor R1 remote from the first tap A1 is connected to the gate terminal of a thirteenth NMOS transistor N13, and the terminal of the second resistor R2 remote from the second tap A2 is connected to the gate terminal of a fourteenth NMOS transistor N14. The drain terminals of N13 and N14 are connected to the supply-voltage terminal VDD. The source terminal of N13 is connected to the gate terminal of N11, i.e., to the first input IN1 of the differential amplifier D, and to a seventh CMOS current source I7. Analogously, the source terminal of N14 is connected to the gate terminal of N12, i.e., to the second input IN2 of the differential amplifier D, and to an eighth CMOS current source I8.

The thirteenth NMOS transistor N13 and the fourteenth NMOS transistor N14 form source-follower stages whose input capacitances are lower than those of the subsequent differential-amplifier transistors N11 and N12, respectively, by about a factor of 5 to 10, so that the RC products formed via the first resistor R1 and the second resistor R2 become negligibly small.

The seventh current source I7 and the eighth current source I8 serve to set the operating points of N13 and N14, respectively. Through the drive of N13 and N14 with the currents I7 and I8, respectively, gate-to-source voltages are developed in N13 and N14 which make it possible to operate the subsequent differential-amplifier transistors N11 and N12 in the pinch-off region of the transistor characteristic. Because of its steeper slope and, hence, higher gain, the pinch-off region is preferable to the ohmic region of the characteristic.

Figure 3:
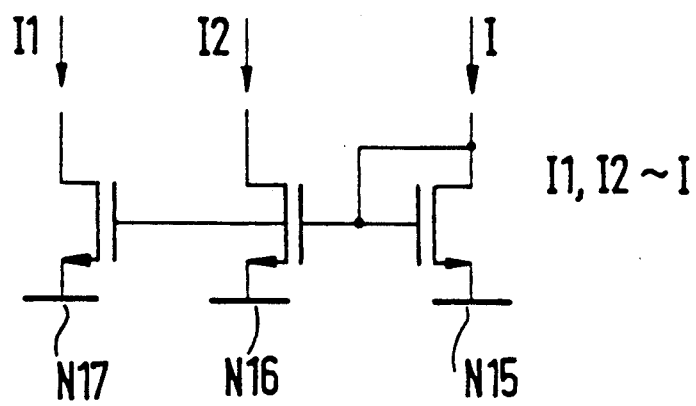
FIG. 3 is a circuit diagram of a controlled current source in accordance with the invention.

A construction of the controlled current source I1, I2 will now be explained with the aid of FIG. 3. The current source includes two NMOS transistors N15, N16 connected as a current mirror, with N15 forming the output current path for the second current source. A seventeenth NMOS transistor N17, whose gate terminal is connected to the gate terminal of N16, forms the output current path for the first current source I1. The output currents I1 and I2 of the two current sources are proportional to the drive current. To balance the oscillator, a unity current transfer ratio, i.e., equal output currents I1 and I2, are chosen. Via the currents I1 and I2, the oscillator frequency can be linearly changed.

The oscillator operates off a +5-V supply. Both resistors R1, R2 have a value of 1 kohm. The two controlled current sources deliver a current in the milliampere range, and the voltage swing of the circuit (voltage drop across the resistors) is in the range of a few hundred millivolts. Each of the differential-amplifier stages has a gain in the range from 2 to 10, and to achieve frequencies clearly above 100 MHz, the capacitor C has a capacitance in the picofarad range. The fourth current source I4 is designed to deliver a current I4 whose value is slightly greater than the sum of the values of the first, second, and third current sources (cf. FIG. 2).

The operation of the oscillator according to the invention will now be explained with the aid of the timing diagram of FIG. 4.

The first line - a - shows the waveform of the voltage UC across the capacitor C. At a first switch point, the capacitor voltage UC is equal to the voltage drop across the first resistor R1 ($UC = R1 \times I3$); at a second switch point, it is equal to the voltage drop (swing) across the second resistor R2 ($UC = R2 \times I3$).

The second line - b - shows the voltage waveform U12 between the first and second switching elements SE1, SE2 of the first switching unit S1 (for U12, see FIG. 2).

In the third line - c -, the voltage swing UR1 at the first resistor R1 is plotted against time t, and in the fourth line - d - the voltage swing UR2 at the second resistor R2 is plotted against time t. The fifth line - e - shows the voltage waveform U87 at the differential-amplifier inputs IN1, IN2. The time axes t are divided into the time intervals 0, $\frac{1}{4}$, $\frac{1}{2}$, $\frac{3}{4}$, ... of the period T of the oscillator signal of frequency f. When the circuit is balanced (i.e., I1=I2, R1=R2), the oscillator frequency f is $$f = I_1 \times C \times R1 \times I3.$$

Assuming that the capacitor C is uncharged (UC=0) at an instant t=0 (cf. FIG. 4), in a first state, a first current path consisting of the first current mirror P1, P2, the first switching element N1 (cf. FIG. 4b, U12>0), the first differential-amplifier stage (N7 conducting), and the second differential-amplifier stage (N12 conducting) is completed (U87>0 in FIG. 4e). As a result, the third switching element SE3, i.e., the third NMOS transistor N3, is ON, so that a voltage $UR1 = I3 \times R1$ (cf. FIG. 4c) appears across the first resistor R1. Since the fourth NMOS transistor N4 (cf. FIG. 2) is OFF in the first state, and on condition that N13 and N14 are identical and, thus, have the same gate-source voltage drop, at the instant t=0, the voltage drop UR1 across the first resistor R1 is equal to the voltage drop U87 between the differential-amplifier inputs (cf. FIGS. 4c and 4e).

With P1 conducting and P4, i.e., the second current mirror, cut off (U12>0), the capacitor C is now charged by the current I2 from the second current source I2 (cf. FIG. 4a). Accordingly, the voltage U87 between the differential-amplifier inputs decreases (cf. FIG. 4e), namely until the capacitor voltage UC is equal to the value $UR1 = R1 \times I3$ and $U87 = 0$ at the instant t=T/4 (cf. FIGS. 4a, 4e).

The circuit now changes to the second state. Since now U12<0, the first current path is blocked and a second current path, consisting of the second current mirror P3, P4, the second NMOS transistor N2, i.e., the second switching element SE2, the first differential-amplifier stage (N8 conducting), and the second differential-amplifier stage (N11 conducting), is completed (cf. FIGS. 4b, 4e, since U87<0. The voltage drop across the second resistor R2 is now $UR2 = U2 \times I3$ (cf. FIG. 4d).

The capacitor C is thus discharged (cf. FIG. 4a) until its voltage $UC = -UR2 = -R2 \times I3$ at the instant t=3T/4 (cf. FIG. 4a), so that the circuit changes back to the first state (cf. FIG. 4b, now U12>0, FIG. 4c, now $UR1 = R1 \times I3$), and reaches the initial state, i.e., UC=0, at the instant t=T. The oscillator cycle just described then repeats itself.

The oscillator described can be used between very low frequencies and about 200 MHz. It permits linear control of the output frequency within wide limits. Compared with conventional bipolar oscillators, it has very low power consumption and considerably higher accuracy. Compared with conventional CMOS oscillators, it exhibits much better temperature and parameter stability because of its simple symmetrical construction, since the individual factors of influence cancel each other. In addition, a frequency range higher by the first power of ten is adjustable.

A particular advantage of this CMOS circuit lies in the fact that it is suitable for implementation on larges-cale integrated-circuit chips, which hitherto needed additional external bipolar voltage-controlled oscillators (VCO) to achieve the necessary accuracy and the very high frequencies.

It is also possible, of course, to construct the oscillator with transistors of reverse conductivity (i.e., to replace PMOS transistors by NMOS transistors, and vice versa).

I claim:

1. CMOS oscillator comprising:
 a differential amplifier having first and second inputs and first and second outputs;
 a first switching unit further comprising
 a first switching element having a control input connected to the first output of the differential amplifier and
 a second switching element having a control input connected to the second output of the differential amplifier;
 a second switching unit further comprising a third switching element and a fourth switching element;
 a first controlled current source;
 a second controlled current source;
 a capacitor for interconnecting the first controlled current source and the second controlled current source;
 a first resistor for connecting the first controlled current source to the first input of the differential amplifier;
 a second resistor for connecting the second current source to the second input of the differential amplifier;
 a first tap located between the first controlled current source and the first resistor;
 a second tap located between the second controlled current source and the second resistor;
 a supply-voltage terminal connectable via the switching path of the first switching element to the first tap or via the switching path of the second switching element to the second tap; and
 a third current source connectable to the first input or the second input of the differential amplifier via the switching path of the third switching element or via the switching path of the fourth switching element respectively.

2. A CMOS oscillator according to claim 1 wherein: the first switching unit further comprises:
 a first NMOS transistor forming the first switching element and having a gate terminal which forms the control input of the first switching element;
 a second NMOS transistor forming the second switching element and having a gate terminal which forms the control input of the second switching element;
 a first current mirror having a reference current path and further comprising a first PMOS transistor having a drain connected to the first tap and a second PMOS transistor;
 a second current mirror having a reference current path and further comprising
 a third PMOS transistor and
 a fourth PMOS transistor having a drain connected to the second tap; and
 a fourth current source connectable to the reference current path of the first current mirror or the reference current path of the second current mirror via the drain-source path of the first NMOS transistor or via the drain source path of the second NMOS transistor, respectively.

3. A CMOS oscillator according to claim 2 wherein: the second switching unit further comprises:
 a third NMOS transistor forming the third switching element and having a gate terminal which forms a control input of the third switching element and which is connected to the first output of the differential amplifier, and
 a fourth NMOS transistor forming the fourth switching element and having a gate terminal which forms the control input of the fourth switching element and which is connected to the second output of the differential amplifier; and the first resistor or the second resistor is connectable to the third current source via the drain-source path of the third NMOS transistor or via the drain-source path of the fourth NMOS transistor, respectively.

4. A CMOS oscillator according to claim 1 wherein the differential amplifier further comprises a first differential amplifier stage preceded by a second differential amplifier stage.

5. A CMOS oscillator according to claim 4 wherein the first differential amplifier stage further comprises:
   a fifth NMOS transistor having gate and drain terminals connected to the supply-voltage terminal and a source terminal forming the first output of the differential amplifier;
   a sixth NMOS transistor having gate and drain terminals connected to the supply-voltage terminal and a source terminal forming the second output of the differential amplifier;
   a fifth current source;
   a seventh NMOS transistor and an eighth NMOS transistor having a source terminal connected to the fifth current source, a drain terminal connected to the source terminal of the fifth NMOS transistor and a gate terminal forming a first input of the first differential amplifier stage; and
   an eighth NMOS transistor having a source terminal connected to the fifth current source, a drain terminal connected to the source terminal of the sixth NMOS transistor, and a gate terminal forming a second input of the first differential amplifier stage.

6. A CMOS oscillator according to claim 5 wherein the second differential amplifier stage further comprises:
   a ninth NMOS transistor and a tenth NMOS transistor having gate and drain terminals connected to the supply-voltage terminal and a source terminal connected to the second input of the first differential amplifier stage;
   a tenth NMOS transistor having gate and drain terminals connected to the supply-voltage terminal and a source terminal connected to the first output of the first differential amplifier stage;
   a sixth current source;
   an eleventh NMOS transistor having a source terminal connected to the sixth current source, a drain terminal connected to the source terminal of the ninth NMOS transistor and a gate terminal forming the first input of the differential amplifier; and
   a twelfth NMOS transistor having a source terminal connected to the sixth current source, a drain terminal connected to the source terminal of the tenth NMOS transistor and a gate terminal forming the second input of the differential amplifier.

7. A CMOS oscillator according to claim 1 further comprising:
   a seventh current source;
   a thirteenth NMOS transistor having a gate terminal connected to the terminal of the first resistor which is not connected to the first tap a drain terminal connected to the supply-voltage terminal and a source terminal connected to the first input of the differential amplifier and to the seventh current source;
   an eighth current source; and
   a fourteenth NMOS transistor having a gate terminal connected to the terminal of the second resistor which is not connected to the second tap, a drain terminal connected to the supply-voltage terminal, and a source terminal connected to the second input of the differential amplifier and to the eight current source.

8. A CMOS oscillator according to claim 2 wherein the fourth current source delivers a current of greater value than the sum of the currents from the first, second, and third current sources.

9. A CMOS oscillator according to claim 8 wherein the first controlled current source and the second controlled current source are identical in construction and deliver equal currents, and the first resistor and the second resistor are equal in value.

10. A CMOS oscillator according to claim 1 wherein the first switching unit further comprises:
    a first PMOS transistor forming the first switching element and having a gate terminal which forms the control input of the first switching element;
    a second PMOS transistor forming the second switching element and having a gate terminal which forms the control input of the second switching element;
    a first current mirror having a reference current path and further comprising a first NMOS transistor having a drain connected to the first tap and a second NMOS transistor;
    a second current mirror having a reference current path and further comprising a third NMOS transistor and a fourth NMOS transistor having a drain connected to the second tap; and
    a fourth current source connectable to the reference current path of the first current mirror or the reference current path of the second current mirror via the drain-source path of the first PMOS transistor or via the drain source path of the second PMOS transistor, respectively.

11. A CMOS oscillator according to claim 10 wherein: the second switching unit further comprises:
    a third PMOS transistor forming the third switching element and having a gate terminal which forms a control input of the third switching element and which is connected to the first output of the differential amplifier, and
    a fourth PMOS transistor forming the fourth switching element and having a gate terminal which forms the control input of the fourth switching element and which is connected to the second output of the differential amplifier; and
    the first resistor or the second resistor is connectable to the third current source via the drain-source path of the third PMOS transistor or via the drain-source path of the fourth PMOS transistor, respectively.

12. A CMOS oscillator according to claim 1 wherein the differential amplifier further comprises a first differential amplifier stage preceded by a second differential amplifier stage.

13. A CMOS oscillator according to claim 12 wherein the first differential amplifier stage further comprises:
    a fifth PMOS transistor having gate and drain terminals connected to the supply-voltage terminal, a source terminal forming the first output and the second output of the differential amplifier;
    a sixth PMOS transistor having gate and drain terminals connected to the supply-voltage terminal and a source terminal forming the second output of the first differential amplifier;

a fifth current source;

a seventh PMOS transistor having a source terminal connected to the fifth current source, a drain terminal connected to the source terminal of the fifth PMOS transistor (N5), and a gate terminal forming a first input of the first differential amplifier stage; and an eighth PMOS transistor having a source terminal connected to the fifth current source, a drain terminal connected to the source terminal of the sixth PMOS transistor, and a gate terminal forming a second input of the first differential amplifier stage.

14. A CMOS oscillator according to claim 13 wherein the second differential amplifier stage further comprises:

a ninth PMOS transistor having gate and drain terminals connected to the supply-voltage terminal and a source terminal connected to the second input of the first differential amplifier stage;

a tenth PMOS transistor having gate and drain terminals connected to the supply-voltage terminal and a source terminal connected to the first output of the first differential amplifier stage;

a sixth current source;

an eleventh PMOS transistor having a source terminal connected to the sixth current source, a drain terminal connected to the source terminals of the ninth PMOS transistor and a gate terminal forming the first input of the differential amplifier;

a twelfth PMOS transistor having a source terminal connected to the sixth current source, a drain terminal connected to the source terminal of the tenth PMOS transistor and a gate terminal forming the second input of the differential amplifier.

15. A CMOS oscillator according to claim 1 further comprising:

a seventh current source;

a thirteenth PMOS transistor having a gate terminal connected to the terminal of the first resistor which is not connected to the first tap a drain terminal connected to the supply-voltage terminal and a source terminal connected to the first input of the differential amplifier and to the seventh current source;

an eighth current source; and a fourteenth PMOS transistor having a gate terminal connected to the terminal of the second resistor which is not connected to the second tap, a drain terminal connected to the supply-voltage terminals, and a source terminal connected to the second input of the differential amplifier and to the eighth current source.

16. A CMOS oscillator according to claim 10 wherein the fourth current source delivers a current of greater value than the sum of the currents from the first, second, and third current sources.

17. A CMOS oscillator according to claim 16 wherein the first controlled current source and the second controlled current source are identical in construction and deliver equal currents, and the first resistor and the second resistor are equal in value.

18. A CMOS oscillator according to claim 1 wherein the first switching unit further comprises:

a first NMOS transistor forming the first switching element and having a gate terminal which forms the control input of the first switching element:

a second NMOS transistor forming the second switching element and having a gate terminal which forms the control input of the second switching element:

a first current mirror having a reference current path and further comprising a first PMOS transistor having a drain connected to the first tap and a second PMOS transistor:

a second current mirror having a reference current path further comprising a third PMOS transistor and a fourth PMOS transistor having a drain connected to the second tap; and a fourth current source connectable to the reference current path of the first current mirror or the reference current path of the second current via the drain-source path of the first NMOS transistor or via the drain source path of the second NMOS transistor.

* * * * *

UNITED STATES PATENT AND TRADEMARK OFFICE
CERTIFICATE OF CORRECTION

PATENT NO. : 5,021,750
DATED : June 4, 1991
INVENTOR(S) : Jürgen Schnabel

It is certified that error appears in the above-identified patent and that said Letters Patent is hereby corrected as shown below:

ON THE TITLE PAGE:

[56] References Cited, U.S. PATENT DOCUMENTS,
       change "4,623,851  11/1976" to
         -- 4,623,851  11/1986 --.

Column 3, line 31, after "first" change "output" to
         -- input --.
Column 3, line 32, delete "the first" (second occurrence).

Column 5, lines 55,56, change "largescale" to
         -- large-scale --.

Column 8, line 3, change "eight" to -- eighth --.

Signed and Sealed this

Nineteenth Day of April, 1994

Attest:

Attesting Officer

BRUCE LEHMAN

Commissioner of Patents and Trademarks